US007652486B2

(12) United States Patent
Shikata

(10) Patent No.: US 7,652,486 B2
(45) Date of Patent: Jan. 26, 2010

(54) CAPACITANCE DETECTION CIRCUIT INCLUDING VOLTAGE COMPENSATION FUNCTION

(75) Inventor: Eiji Shikata, Sendai (JP)

(73) Assignee: Freescale Semiconductor, Inc., Austin, TX (US)

( * ) Notice: Subject to any disclaimer, the term of this patent is extended or adjusted under 35 U.S.C. 154(b) by 196 days.

(21) Appl. No.: 12/015,515

(22) Filed: Jan. 17, 2008

(65) Prior Publication Data

US 2009/0184723 A1 Jul. 23, 2009

(51) Int. Cl.
*G01R 27/26* (2006.01)
(52) U.S. Cl. .................. 324/661; 324/672; 324/679
(58) Field of Classification Search .......... 324/658–690
See application file for complete search history.

(56) References Cited

U.S. PATENT DOCUMENTS 5,751,154 A * 5/1998 Tsugai ..................... 324/661
5,821,421 A * 10/1998 Le Reverend ............ 73/514.32
6,159,761 A 12/2000 Okada
6,257,061 B1 * 7/2001 Nonoyama et al. ....... 73/514.32
6,373,265 B1 4/2002 Morimoto et al.
6,940,495 B2 9/2005 Morimoto et al.
7,075,527 B2 7/2006 Takagi et al.
2001/0003326 A1 6/2001 Okada et al.
2004/0187593 A1 9/2004 Okada
2005/0243064 A1 11/2005 Morimoto et al.
2007/0159183 A1 * 7/2007 Umemura et al. ........... 324/661

FOREIGN PATENT DOCUMENTS

JP 2006284272 A 10/2006

* cited by examiner

*Primary Examiner*—Timothy J Dole
*Assistant Examiner*—Farhana Hoque
(74) *Attorney, Agent, or Firm*—Charles Bergere

(57) ABSTRACT

A capacitance detection circuit that compensates for the fluctuation of a reference voltage with a simple structure. A C-V circuit for a sensor element generates a detection signal by amplifying a capacitance change value of the sensor element by a predetermined gain based on a reference voltage. A voltage compensation circuit, which is connected to the C-V circuit and supplies a reference voltage to the C-V circuit, reduces the gain relative to a deviation amount when the reference voltage fluctuates by a predetermined deviation amount.

17 Claims, 3 Drawing Sheets

CAPACITANCE DETECTION CIRCUIT INCLUDING VOLTAGE COMPENSATION FUNCTION

BACKGROUND OF THE INVENTION

The present invention relates to a capacitance detection circuit that can be used with an acceleration sensor, and more specifically, to a capacitance detection circuit incorporating a voltage compensation circuit that compensates for deviations of a reference voltage.

An acceleration sensor includes a capacitance-voltage conversion circuit (hereinafter referred to as the "C-V circuit") for converting capacitance fluctuation of a sensor element caused by changes in a physical quantity (acceleration) to an electrical signal. A sensor output is obtained by amplifying the electrical signal generated by the C-V circuit.

FIG. 1 is a schematic circuit diagram of a conventional capacitance detection circuit. The capacitance detection circuit includes a C-V circuit 100 that is connected to a sensor element 10. The C-V circuit 100 further includes an operational amplifier 20, switch element 22, and feedback capacitor 24. The operational amplifier 20 has an inversion input terminal that is connected to the sensor element 10, a non-inversion input terminal that receives a reference voltage Vr, and an output terminal that outputs a detection signal Vo. The switch element 22 is connected between the inversion input terminal and the output terminal of the operational amplifier 20. The feedback capacitor 24 is connected in parallel to the switch element 22. The switch element 22 is activated and deactivated by a control signal provided from a drive circuit (not shown). Specifically, the control signal activates the switch element 22 in a reset phase, and deactivates the switch element 22 in a sampling phase.

The sensor element 10 includes first and second variable capacitors 12 and 14 and a parasitic capacitor element 16. The first variable capacitor 12 has a movable electrode 12a, which is connected to the inversion input terminal of the operational amplifier 20, and a fixed electrode 12b, which receives a carrier wave Va that functions as a drive signal. The second variable capacitor 14 has a movable electrode 14a, which is connected to the movable electrode 12a of the first variable capacitor 12, and a fixed electrode 14b, which receives a carrier wave Vb that functions as a drive signal. The carrier waves Va and Vb have opposite phases and are cyclically applied to the fixed electrodes 12b and 14b by the drive circuit. In the reset phase, for example, the carrier wave Va is set to voltage V1 (for example, 0 V), and the carrier wave Vb is set to voltage V2 (for example, 3 V), which has a phase opposite to the voltage V1. In the sampling phase, the carrier wave Va is set to the voltage V2, and the carrier wave Vb is set to the voltage V1. The parasitic capacitor element 16 is a parasitic capacitor configured within the sensor element 10. In FIG. 1, the parasitic capacitor element 16 is represented as a parasitic capacitor 16 including a first electrode, which is connected to the inversion input terminal of the operational amplifier 20, and a second electrode, which receives a reference voltage Vr.

The movable electrodes 12a and 14a of the first and second variable capacitors 12 and 14 are moved by the same amount in the same direction (the fixed electrode 12b side or fixed electrode 14b side) in accordance with changes in acceleration added to the sensor element 10. The movement of the movable electrodes 12a and 14a produce changes in the differential capacitor formed by the variable capacitors 12 and 14. Thus, the sensor element 10 detects a change in the acceleration as a change in the capacitance of the variable capacitors 12 and 14.

The operation of the C-V circuit 100 will now be described. During the reset phase, the switch element 22 is activated, voltage V1 (Va) is applied to the fixed electrode 12b of the first variable capacitor 12, and voltage V2 (Vb) is applied to the fixed electrode 14b of the second variable capacitor 14. As a result, the feedback capacitor 24 is discharged. In this state, the operational amplifier 20 outputs a detection signal Vo, which has substantially the same level as the reference voltage Vr.

The sampling phase then starts. During the sampling phase, the switch element 22 is deactivated, voltage V2 (Va) is applied to the fixed electrode 12b of the first variable capacitor 12, and voltage V1 (Vb) is applied to the fixed electrode 14b of the second variable capacitor 14. As a result, the feedback capacitor 24 is charged in correspondence with the displacement of the movable electrodes 12a and 14a. Accordingly, the operational amplifier 20 generates a detection signal Vo corresponding to the charging of the feedback capacitor 24, or change in the capacitance of the sensor element 10. Then, the reset phase and sampling phases are alternately repeated by the operation described above.

In such an acceleration detection operation, a deviation occurs in the output of the operational amplifier 20 when the reference voltage Vr of the operational amplifier 20 fluctuates between the reset phase and sampling phase due to the effect of noise or the unstable operation of a regulator (not shown in the drawing) that generates the reference voltage Vr. When the reference voltage Vr fluctuates by a deviation amount Vd during the sampling phase, a reference voltage that includes the deviation amount Vd (that is, Vr+Vd) is supplied to the non-inverting input terminal of the operational amplifier 20. In this case, the inverting input terminal of the operational amplifier 20 is biased to the same potential as the reference voltage (Vr+Vd) by the negative feedback function (imaginary short-circuiting) of the operational amplifier 20. That is, the voltage fed back to the inverting input terminal of the operational amplifier 20 is shifted by the same amount as the deviation amount Vd of the reference voltage Vt. In this state, the output deviation amount Vc of the operational amplifier 20 caused by the deviation amount Vd may be expressed by the equation shown below.

$$Vc = [(Cg1 + Cg2 + CF)/CF]Vd \qquad \text{Equation 1}$$

In equation 1, [Cg1] represents the capacitance of the first variable capacitor 12, [Cg2] represents the capacitance of the second variable capacitor 14, and [CF] represents the capacitance of the feedback capacitor 24.

Equation 1 above signifies that the deviation amount Vd of the reference voltage Vr between the reset and sampling phases is amplified by the gain G1 ((Cg1+Cg2+CF)/CF) of the entire system including the sensor element 10 and C-V circuit 100, and the amplified deviation is reflected in the output voltage of the operational amplifier 20. That is, the output voltage of the operational amplifier 20 is represented as a value (V0+Vc), which includes the output deviation amount Vc of a multiple of the gain G1 of the deviation amount Vd relative to a normal detection value Vo.

Japanese Laid-Open Patent Publication No. 2006-284272 discloses a noise reduction scheme applicable to a C-V circuit for an acceleration sensor. The acceleration sensor described in this publication (refer to FIG. 1 of the publication) includes a sensor element 10, a drive circuit 30 for generating carrier waves PW1 and PW2 that drive the sensor element 10, a C-V circuit 21 for detecting a capacitance fluctuation value of the sensor 10 based on a reference voltage Vref, and a filter circuit 40 arranged between a power source 50 and the drive circuit 30. In this acceleration sensor, the operating voltage of the drive circuit 30 is supplied from the power source 50 via the filter circuit 40. The filter circuit 40 eliminates the noise included in the gain of the supplied power between the power source 50 and the drive circuit 30. Therefore, the voltages of the carrier waves PW1 and PW2 supplied from the drive circuit 30 to the sensor element 10 are prevented from being fluctuated by noise.

However, the conventional circuit described in the publication does not take into consideration the possibility of fluctuation of the reference voltage Vref of the C-V circuit 21. As described above, there is a possibility that the reference voltage Vref of the C-V circuit 21 may fluctuate due to the influence of noise and the unstable operation of the regulator. Fluctuation of the reference voltage Vref may produce an output deviation amount in the C-V circuit 21 that is larger than the deviation amount of the reference voltage Vref. This lowers the output accuracy (detection accuracy) of the C-V circuit 21. Accordingly, the conventional circuit described in the above publications has problems similar to those of the conventional circuit of FIG. 1.

A high performance regulator capable of generating a reference voltage with high precision may be designed to prevent such a deviation in the reference voltage. However, this would increase the chip area, raise the production cost, and thus may not be able to satisfy system requirements. A practical circuit that compensates for the deviation of the reference voltage with a simple and inexpensive configuration is thus desired.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
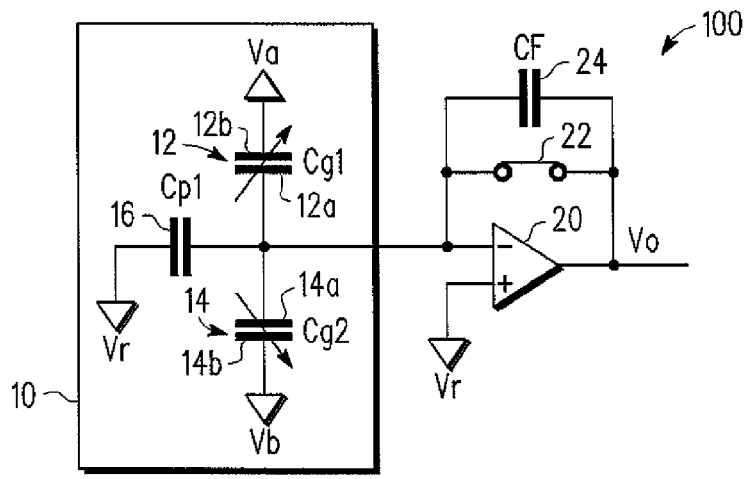
FIG. 1 is a schematic circuit diagram of a conventional capacitance detection circuit.

In the drawings, like numerals are used for like elements throughout.

The present invention provides a capacitance detection circuit having a simple and inexpensive configuration that compensates for the deviation of the reference voltage.

One aspect of the present invention is a capacitance detection circuit for detecting a capacitance change value of a sensor element. The capacitance detection circuit includes a C-V circuit, connected to the sensor element, for amplifying the capacitance change value of the sensor element by a predetermined gain based on a reference voltage to generate a detection signal. A voltage compensation circuit, connected to the C-V circuit, supplies the reference voltage to the C-V circuit. When the reference voltage fluctuates by a certain deviation amount, the voltage compensation circuit reduces the gain relative to the deviation amount.

Other aspects and advantages of the present invention will become apparent from the following description, taken in conjunction with the accompanying drawings, illustrating by way of example the principles of the invention.

Figure 2:
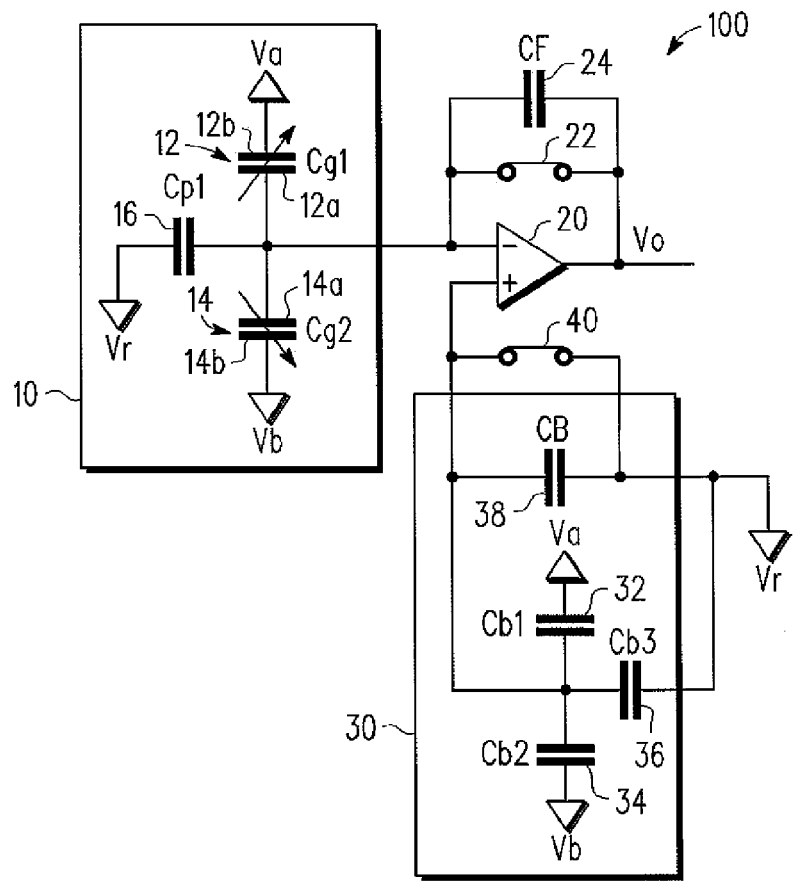
FIG. 2 is a schematic circuit diagram of a capacitance detection circuit according to a first embodiment of the present invention.

A capacitance detection circuit according to a first embodiment of the present invention will now be discussed with reference to FIG. 2. As shown in FIG. 2, the capacitance detection circuit of the first embodiment includes a C-V circuit 100 connected to a sensor element 10, a voltage compensation circuit 30, and a switch element 40. The C-V circuit 100 includes an operational amplifier 20, a switch element 22, and a feedback capacitor 24. That is, the capacitance detection circuit of the first embodiment is formed by incorporating the voltage compensation circuit 30 and the switch element 40 in the C-V circuit 100 of FIG. 1. The switch element 22 functions as a first switch element, and the switch element 40 functions as a second switch element. Elements shown in FIG. 2 that are the same as those shown in FIG. 1 are denoted by the same reference numbers and will not be described in detail.

The voltage compensation circuit 30, which is connected to the non-inverting input terminal of the operational amplifier 20, includes a plurality (first through fourth) of balance capacitors 32, 34, 36, and 38. More specifically, in the voltage compensation circuit 30, the first balance capacitor 32 has a first electrode, which is connected to the non-inversion terminal of the operational amplifier 20, and a second electrode, which receives a carrier wave Va (first drive signal) generated by a drive circuit (not shown). The second balance capacitor 34 has a first electrode, which is connected to the first electrode of the first balance capacitor 32, and a second electrode, which receives a carrier wave Vb (second drive signal) generated by the drive circuit. The third balance capacitor 36 has a first electrode, which is connected to the non-inverting input terminal of the operational amplifier 20, and a second electrode, which receives a reference voltage Vr. The fourth balance capacitor 38 has a first electrode, which is connected to the non-inverting input terminal of the operational amplifier 20, and a second electrode, which is connected to the second electrode of the third balance capacitor 36.

The first balance capacitor 32 has a capacitance [Cb1], and the second balance capacitor 34 has a capacitance [Cb2]. In the first embodiment, the sum of the first and second variable capacitors 12 and 14 of the sensor element 10 is set at the same value as the sum of the first and second balance capacitors 32 and 34 of the voltage compensation circuit 30 (first capacitance, namely, Cg1+Cg2=Cb1+Cb2).

The third balance capacitor 36 has a capacitance [Cb3]. In the first embodiment, the parasitic capacitor 16 of the sensor element 10 and the third balance capacitor 36 of the voltage compensation circuit 30 are set to the same value (a second capacitance, namely, Cp1=Cb3).

The fourth balance capacitor 38 has a capacitance [CB]. In the first embodiment, the feedback capacitor 24 and the fourth balance capacitor 38 of the voltage compensation circuit 30 are set to the same value (third capacitance, namely, CF=CB).

The second switch element 40 is connected in parallel to the fourth balance capacitor 38. The second switch element 40 is activated and deactivated simultaneously with the first switch element 22 by a control signal provided to the first switch element 22 from the drive circuit. More specifically, the first and second switch elements 22 and 40 are activated by a control signal in the reset phase, and deactivated by a control signal in the sampling phase.

In the capacitance detection circuit, the feedback capacitor 24 and the capacitors 12, 14, and 16 in the sensor element 10 set a first load capacitance that is applied to the inversion input terminal of the operational amplifier 20. The first through fourth balance capacitors 32, 34, 36, and 38 of the voltage compensation circuit 30 set a second load capacitance that is applied to the non-inversion input terminal of the operational amplifier 20. In this state, the capacitances of the first through fourth balance capacitors 32, 34, 36, and 38 are set to be equal to the capacitances of the sensor element 10 and feedback capacitor 24. The first load capacitance and the second load capacitance are therefore set to have substantially the same value.

The operation of the capacitance detection circuit will now be discussed.

During the reset phase period, the first switch element 22 and the second switch element 40 are activated. Furthermore, the voltage V1 (Va) is applied to the fixed electrode 12$b$ of the first variable capacitor 12 and the second electrode of the first balance capacitor 32. The voltage V2 (Vb) is applied to the fixed electrode 14$b$ of the second variable capacitor 14 and the second electrode of the second balance capacitor 34. This discharges the feedback capacitor 24 and the fourth balance capacitor 38, and the reference voltage Vr is supplied to the non-inverting input terminal of the operational amplifier 20 via the switch element 40. In this state, the operational amplifier 20 outputs a detection signal Vo having substantially the same level as the reference voltage Vr.

Then, the sampling phase is started. During the sampling phase period, the first switch element 22 and the second switch element 40 are deactivated. Further, the voltage V2 is applied to the fixed electrode 12$b$ of the first variable capacitor 12 and the second electrode of the first balance capacitor 32. The voltage V1 is applied to the fixed electrode 14$b$ of the second variable capacitor 14 and the second electrode of the second balance capacitor 34. This charges the feedback capacitor 24 in correspondence with the movement of the movable electrodes 12$a$ and 14$a$. Accordingly, the operational amplifier 20 outputs a voltage corresponding to the charge stored in the feedback capacitor 24 based on the reference voltage Vr. That is, the C-V circuit 100 amplifies the capacitance change value of the sensor element 10, caused by a change in acceleration, by a predetermined gain based on the reference voltage Vr to generate a detection signal Vo. In this case, the gain is the gain of the entire system that includes the sensor element 10, the C-V circuit 100, and the voltage compensation circuit 30. Thereafter, the reset phase and sampling phases are alternately repeated by the operations described above.

A case in which the reference voltage Vr of the operational amplifier 20 fluctuates between the reset and sampling phases in the acceleration detection operation will now be discussed.

For example, when the reference voltage Vr fluctuates by a deviation amount Vd in the sampling phase, a reference voltage including the deviation amount Vd (Vr+Vd) is supplied to the second electrode of the third balance capacitor 36 and the second electrode of the fourth balance capacitor 38. The voltage compensation circuit 30 reduces the deviation amount Vd with the first through fourth balance capacitors 32, 34, 36, and 38 and corrects the reference voltage Vr with the reduced deviation amount Vs to generate a corrected reference voltage (Vr+Vs). As a result, the corrected reference voltage (Vr+Vs) generated by the voltage compensation circuit 30 is supplied to the non-inversion input terminal of the operational amplifier 20. In this state, the deviation amount Vs of the reference voltage (Vr+Vs) relative to the reference voltage Vr may be expressed by the equation shown below.

$$Vs = [(Cb3+CB)/(Cb1+Cb2+Cb3+CB)]Vd \qquad \text{Equation 2}$$

In this case, the inverting input terminal of the operational amplifier 20 is biased to substantially the same potential as the reference voltage (Vr+Vs) by the negative feedback function (imaginary short-circuiting) of the operational amplifier 20. In this state, the output deviation amount Vc of the operational amplifier 20 caused by the deviation amount Vd of the reference voltage Vr may be expressed by the equation shown below.

$$Vc = [(Cg1+Cg2+Cp1+CF)Vs - Cp1*Vd]/CF \qquad \text{Equation 3}$$

Accordingly, the output deviation amount Vc may be determined by substituting equation 2 in equation 3.

The capacitance Cg1+Cg2 is set at the same value as the capacitance Cb1+Cb2 (first capacitance), the capacitances Cp1 and Cb3 are set at the same value (second capacitance), and the capacitances CF and CB are set at the same value (third capacitance). Accordingly, the output deviation amount Vc of the operational amplifier 20 is obtained as [Vc=Vd] by substituting the first through third capacitances in equations 2 and 3. This indicates that the gain of the entire system relative to the deviation amount Vd of the reference voltage Vr is reduced to "1" by the voltage compensation circuit 30. Accordingly, in the first embodiment, the deviation amount Vd of the reference voltage Vr is not amplified by the gain of the entire system and reflected to the output voltage of the operational amplifier 20 with the same value. Thus, the output deviation amount Vc of the operational amplifier 20 (C-V circuit 100) relative to the deviation amount Vd is reduced in comparison with the conventional circuit shown in FIG. 1.

As described above, the voltage compensation circuit 30 reduces only the gain relative to the deviation amount Vd. Accordingly, with regard to the capacitance change of the sensor element 10, the C-V circuit 100 amplifies the capacitance change value of the sensor element 10 by the normal gain of the entire system based on the corrected reference voltage (Vr+Vs) to generate a detection signal (V0+Vc).

Figure 3:
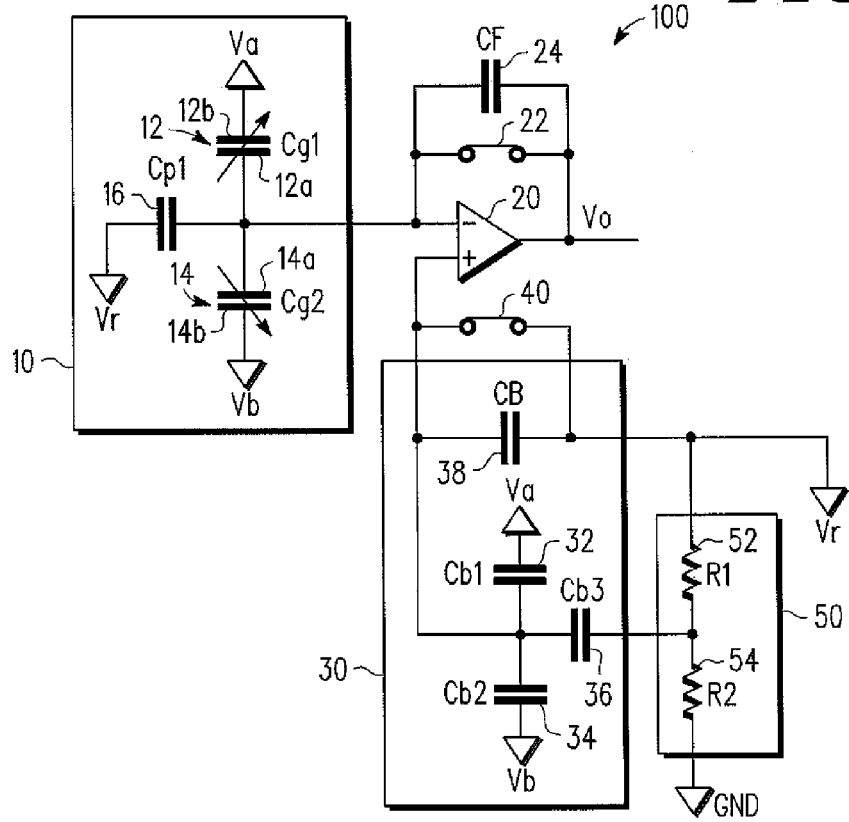
FIG. 3 is a schematic circuit diagram of a capacitance detection circuit according to a second embodiment of the present invention.

A capacitance detection circuit according to a second embodiment of the present invention will now be discussed with reference to FIG. 3. As shown in FIG. 3, the capacitance detection circuit of the second embodiment is formed by incorporating a voltage divider 50 in the capacitance detection circuit of the first embodiment (FIG. 2). Elements shown in FIG. 3 that are the same as those of the capacitance detection circuit shown in FIG. 2 are denoted by the same reference numbers and will not be described in detail.

The voltage divider 50 is connected to the voltage compensation circuit 30. The voltage divider 50 divides the reference voltage Vr by a predetermined ratio and supplies the divided reference voltage to the voltage compensation circuit 30. Accordingly, the voltage compensation circuit 30 of the second embodiment generates a corrected reference voltage (Vr+Vs) based on the divided reference voltage generated by the voltage divider 50.

The voltage divider 50 includes a resistor element 52 (first resistor circuit) having a first resistance R1 and a resistor element 54 (second resistor circuit) having a second resistance R2. The first resistor element 52 is connected between the second electrode of the third balance capacitor 36 and the second electrode of the fourth balance capacitor 38. The second resistor element 54 is connected between the second electrode of the third balance capacitor 36 and ground GND.

Thus, the two resistor elements 52 and 54 are connected in series. The voltage divider 50 divides the reference voltage Vr in accordance with the resistance ratio X of the resistor elements 52 and 54 (X=R2/(R1+R2)). In this state, the deviation amount Vs of the corrected reference voltage (Vr+Vs) relative to the reference voltage Vr is expressed by the following equation using the resistance ratio X.

$$Vs=[(CB+X*Cb3)/(Cb1+Cb2+Cb3+CB)]Vd \quad \text{Equation 4}$$

In this case, the inverting input terminal of the operational amplifier 20 is biased to substantially the same potential as the reference voltage (Vr+Vs) by the negative feedback function (imaginary short-circuiting) of the operational amplifier 20. The output deviation amount Vc of the operational amplifier 20 caused by the deviation amount Vd of the reference voltage Vr may therefore be expressed by equation 3 shown below in the same manner as the first embodiment.

$$Vc=[(Cg1+Cg2+Cp1+CF)Vs-CP1*Vd]/CF \quad \text{Equation 3}$$

Accordingly, the output deviation amount Vc of the operational amplifier 20 (C-V circuit 100) is obtained by substituting equation 4 in equation 3.

In the same manner as in the first embodiment, in the second embodiment, the capacitance Cg1+Cg2 is set to the same value as the capacitance Cb1+Cb2 (first capacitance), the capacitances CP1 and Cb3 are set at the same value (second capacitance), and the capacitances CF and CD are set at the same value (third capacitance). The output deviation amount Vc of the operational amplifier 20 may therefore be obtained by substituting the first through third capacitances in equations 3 and 4.

$$Vc=[(X*CP1-CP1+CF)/CF]Vd \quad \text{Equation 5}$$

The right side of equation 5 becomes "0" (zero) when the resistance ratio X is properly adjusted so that the expression (X*CP1−CP1+CF) becomes "0" (zero) in equation 5. That is, the output deviation amount Vc becomes [Vc=0]. This indicates that the gain relative to the deviation amount Vd of the reference voltage Vr is substantially set at "0". In this case, the gain is the gain of the entire system that includes the sensor element 10, the C-V circuit 100, the voltage compensation circuit 30, and the voltage divider 50. Accordingly, in the second embodiment, the output voltage of the operational amplifier 20, that is, the C-V circuit 100, is not influenced by the deviation of the reference voltage Vr between the reset and sampling phases. In other words, the operational amplifier 20 generates a proper detection signal Vo that corresponds to the capacitance change value of the sensor element 10 regardless of the degree of the deviation Vd of the reference voltage Vr. Accordingly, in the second embodiment, the occurrence of an output deviation of the operational amplifier 20 is substantially prevented.

As mentioned above, the voltage compensation circuit 30 and the voltage divider 50 set only the gain relative to the deviation amount Vd to "0" (zero). Accordingly, with regard to the capacitance change of the sensor element 10, the C-V circuit 100 amplifies the capacitance change value of the sensor element 10 by the normal gain of the entire system based on the corrected reference voltage (Vr+Vs) generated by the voltage compensation circuit 30 and the voltage divider 50 to generate a detection signal Vo.

The resistances R1 and R2 (ratio) are set to satisfy the following equation by using X=R2/(R1+R2) in the expression [X*CP1−CP1+CF=0].

$$R2/R1=CP1/CF-1 \quad \text{Equation 6}$$

Simulation results of a conventional capacitance detection circuit and the capacitance detection circuit of the present invention will now be described.

Figure 4:
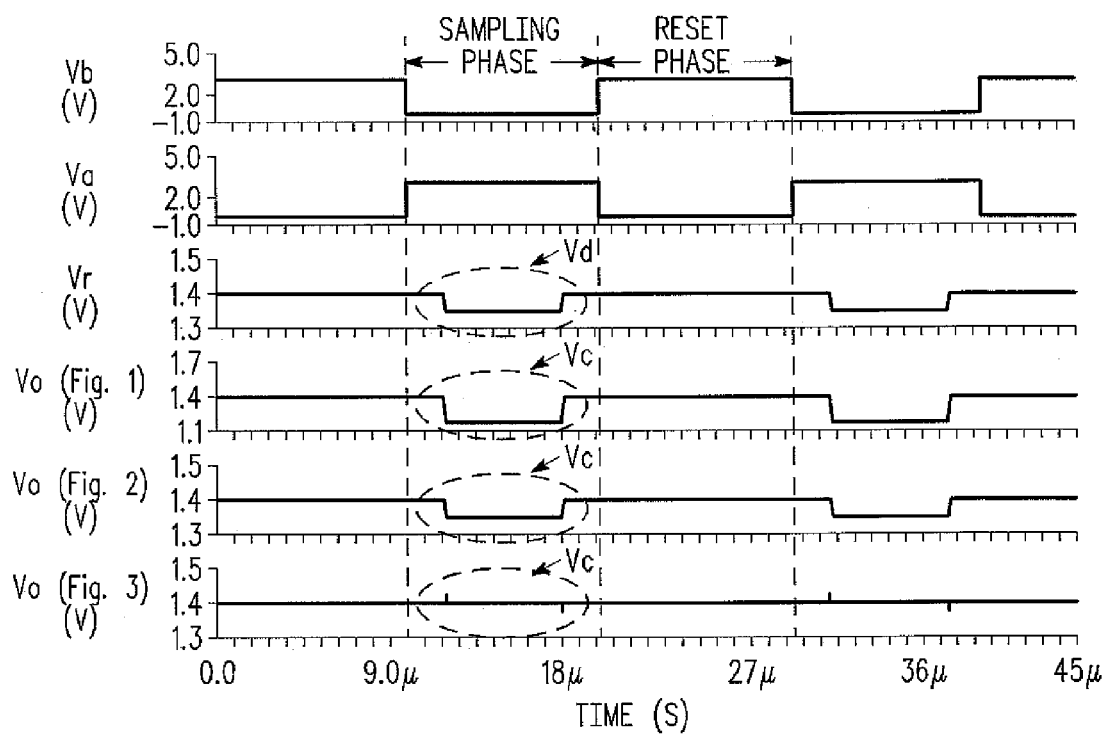
FIG. 4 is a schematic waveform diagram showing comparison results of the C-V circuit output deviation amounts of FIGS. 1 through 3 when the deviation amount of the reference voltage is negative.
Figure 5:
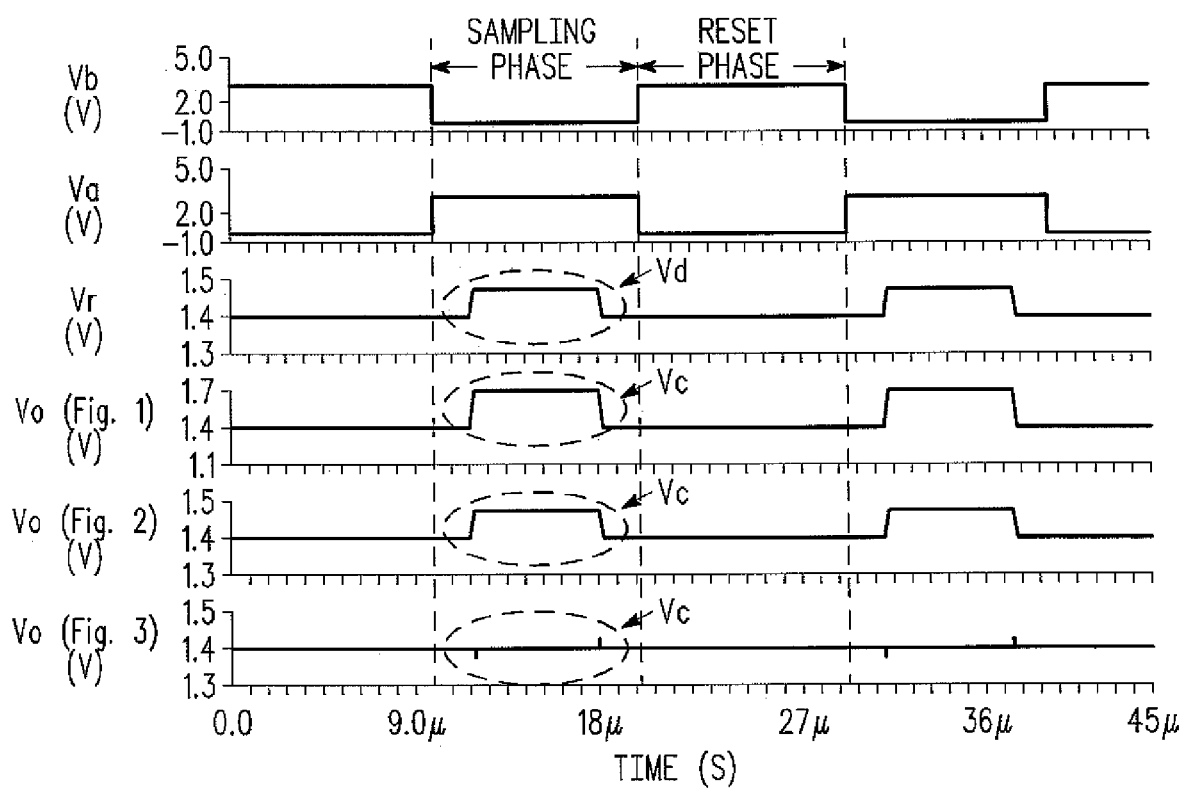
FIG. 5 is a schematic waveform diagram showing the comparison results of the C-V circuit output deviation amounts of FIGS. 1 through 3 when the deviation amount of the reference voltage is positive.

FIGS. 4 and 5 are schematic waveform diagrams showing simulation results of the operation of the capacitance detection circuits of FIGS. 1 through 3. FIG. 4 shows the comparison results of the output deviation Vc of the C-V circuits 100 of FIGS. 1 through 3 when the deviation amount Vd is negative (−Vd). FIG. 5 shows the comparative results of the output deviation Vc of the C-V circuits 100 of FIGS. 1 through 3 when the deviation amount Vd is positive (+Vd).

In the simulation, for the capacitance detection circuits of FIGS. 1 through 3 1 the capacitances Cg1, Cg2, Cb1, and Cb2 were set at 400 fF, the capacitances CP1 and Cb3 were set at 4000 fF, and the capacitances CF and CB were set at 200 fF. With regard to the capacitance detection circuit of FIG. 3, the first and second resistances R1 and R2 were selected so as to satisfy the relationship of equation 6. For example, the first resistance R1 was set at 5 kΩ, and the second resistance R2 was set at 95 kΩ.

As shown in FIG. 4, when the reference voltage Vr is deviated by −Vd (approximately −50 mV) in the sampling phase, the output voltage Vo of the operational amplifier 20 drops by a deviation amount Vc of approximately 250 mV in the C-V circuit 100 of FIG. 1. Comparatively, the drop (Vc) of the output voltage Vo is suppressed to approximately 50 mV in the C-V circuit 100 of FIG. 2. That is, the output deviation Vc of the C-V circuit 100 of the first embodiment is reduced to approximately one fifth from that of the conventional circuit shown in FIG. 1. Furthermore, the drop (Vc) of the output voltage Vo is substantially prevented in the C-V circuit 100 of the second embodiment shown in FIG. 3.

As shown in FIG. 5, when the reference voltage Vr is deviated by +Vd (approximately +50 mV) in the sampling phase, the output voltage Vo of the operational amplifier 20 rises with a deviation amount Vc of approximately 250 mV in the C-V circuit 100 of FIG. 1. Comparatively, the deviation amount Vc of the output voltage Vo is suppressed to approximately 50 mV in the C-V circuit 100 of FIG. 2. That is, the output deviation Vc of the C-V circuit 100 of the first embodiment is reduced to approximately one fifth of that of the conventional circuit shown in FIG. 1. Moreover, the deviation (Vc) of the output voltage Vo is substantially prevented in the C-V circuit 100 of the second embodiment shown in FIG. 3.

As described above, the capacitance detection circuit of the present invention includes a voltage compensation circuit 30 (and/or a voltage divider 50) that compensates for deviation of the reference voltage Vr. Therefore, deviation of the reference voltage Vr is compensated for by a simple and inexpensive structure.

It should be apparent to those skilled in the art that the present invention may be embodied in many other specific forms without departing from the spirit or scope of the invention. Particularly, it should be understood that the present invention may be embodied in the following forms.

The voltage compensation circuit 30 in each of the above embodiments does not have to be formed by the first through fourth balance capacitors 32, 34, 36, and 38. For example, the voltage compensation circuit 30 may be formed by five or more balance capacitors so that the first load capacitance set for the inversion input terminal of the operational amplifier 20 and the second load capacitance set for the non-inversion input terminal of the operational amplifier 20 are equal.

In the second embodiment, the first and second resistor circuits of the voltage divider 50 may be formed by elements other than the resistor elements 52 and 54 elements, for example, by two transistors. Further, the divided reference voltage generated by the voltage divider 50 does not have to be generated by the resistance division performed by the resistor elements 52 and 54 and may be generated, for example, by using a regulator arranged in an external circuit.

In the second embodiment, the output deviation amount Vc of the operational amplifier 20 does not need to be exactly "0" (zero).

The present examples and embodiments are to be considered as illustrative and not restrictive, and the invention is not to be limited to the details given herein, but may be modified within the scope and equivalence of the appended claims.

What is claimed is:

1. A capacitance detection circuit for detecting a capacitance change value of a sensor element, the capacitance detection circuit comprising:
   a C-V circuit, connected to the sensor element, for amplifying the capacitance change value of the sensor element by a predetermined gain based on a reference voltage to generate a detection signal; and
   a voltage compensation circuit, connected to the C-V circuit, for supplying the reference voltage to the C-V circuit, wherein when the reference voltage fluctuates by a predetermined deviation amount, the voltage compensation circuit reduces the gain relative to the deviation amount;
   wherein the C-V circuit includes:
      an operational amplifier having a first input terminal connected to the sensor element, a second input terminal connected to the voltage compensation circuit, and an output terminal that outputs the detection signal; and
      a feedback capacitor connected between the first input terminal and output terminal of the operational amplifier;
   the sensor element includes:
      a first variable capacitor having a movable electrode connected to the first input terminal of the operational amplifier and a fixed electrode that receives a first drive signal;
      a second variable capacitor having a movable electrode connected to the movable electrode of the first variable capacitor and a fixed electrode that receives a second drive signal; and
      a parasitic capacitor element formed in the sensor element and functioning as a parasitic capacitor connected to the first input terminal of the operational amplifier;
   wherein the sensor element and feedback capacitor set a first load capacitance applied to the first input terminal of the operational amplifier; and
   the voltage compensation circuit includes a plurality of balance capacitors that set a second load capacitance, which is applied to the second input terminal of the operational amplifier, to substantially the same value as the first load capacitance;
   wherein the plurality of balance capacitors include:
   a first balance capacitor having a first electrode, which is connected to the second input terminal of the operational amplifier, and a second electrode, which receives the first drive signal;
   a second balance capacitor having a first electrode, which is connected to the first electrode of the first balance capacitor, and a second electrode, which receives the second drive signal;
   a third balance capacitor having a first electrode, which is connected to the second input terminal of the operational amplifier, and a second electrode, which receives the reference voltage; and
   a fourth balance capacitor having a first electrode, which is connected to the second input terminal of the operational amplifier, and a second electrode, which is connected to the second electrode of the third balance capacitor.

2. The capacitance detection circuit of claim 1, wherein:
   a sum of the first variable capacitor and the second variable capacitor has a first capacitance, the parasitic capacitor has a second capacitance, and the feedback capacitor has a third capacitance; and
   a sum of the first balance capacitor and the second balance capacitor is set to the first capacitance, the third balance capacitor is set to the second capacitance, and the fourth balance capacitor is set to the third capacitance.

3. The capacitance detection circuit of claim 1, further comprising:
   a first switch element connected in parallel to the feedback capacitor; and
   a second switch element connected in parallel to the fourth balance capacitor and activated and deactivated simultaneously with the first switch element.

4. The capacitance detection circuit of claim 1, further comprising:
   a voltage divider, connected to the second electrode of the third balance capacitor and the second electrode of the fourth balance capacitor, for dividing the reference voltage by a predetermined ratio and applying the divided reference voltage to the second electrode of the third balance capacitor.

5. The capacitance detection circuit of claim 4, wherein:
   a sum of the first variable capacitor and the second variable capacitor has a first capacitance, the parasitic capacitor has a second capacitance, and the feedback capacitor has a third capacitance; and
   a sum of the first balance capacitor and the second balance capacitor is set to the first capacitance, the third balance capacitor is set to the second capacitance, and the fourth balance capacitor is set to the third capacitance.

6. The capacitance detection circuit of claim 5, wherein: the voltage divider includes:
   a first resistor circuit having a first resistance; and
   a second resistor circuit having a second resistance; and
   the predetermined ratio is expressed by (second resistance/(first resistance+second resistance)); and
   the first resistance and the second resistance are set to satisfy the following equation:

second resistance/first resistance=(second capacitance/third capacitance)−1.

7. A capacitance detection circuit for detecting a capacitance change value of a sensor element, the capacitance detection circuit comprising:
   a C-V circuit, connected to the sensor element, for amplifying the capacitance change value of the sensor element by a predetermined gain based on a reference voltage to generate a detection signal;
   a voltage compensation circuit, connected to the C-V circuit, for supplying the reference voltage to the C-V circuit, wherein when the reference voltage is fluctuated by a certain deviation amount, the voltage compensation circuit reduces the gain relative to the deviation amount; and
   a voltage divider, connected to the voltage compensation circuit, for dividing the reference voltage by a predetermined ratio and supplying the divided reference voltage to the voltage compensation circuit.

8. The capacitance detection circuit of claim 7, wherein the voltage compensation circuit sets the gain relative to the deviation amount of the reference voltage to one or less.

9. The capacitance detection circuit of claim 8, wherein the voltage compensation circuit sets the gain relative to the deviation amount of the reference voltage to substantially zero.

10. The capacitance detection circuit of claim 7, wherein:
the voltage compensation circuit reduces the deviation amount of the reference voltage, and corrects the reference voltage with the reduced deviation amount to generate a corrected reference voltage; and
the C-V circuit converts the capacitance change value of the sensor element to the detection value using the corrected reference voltage.

11. The capacitance detection circuit of claim 7, wherein:
the C-V circuit includes:
an operational amplifier having a first input terminal connected to the sensor element, a second input terminal connected to the voltage compensation circuit, and an output terminal that outputs the detection signal; and
a feedback capacitor connected between the first input terminal and output terminal of the operational amplifier;
the sensor element includes:
a first variable capacitor having a movable electrode connected to the first input terminal of the operational amplifier and a fixed electrode that receives a first drive signal;
a second variable capacitor having a movable electrode connected to the movable electrode of the first variable capacitor and a fixed electrode that receives a second drive signal; and
a parasitic capacitor element formed in the sensor element and functioning as a parasitic capacitor connected to the first input terminal of the operational amplifier;
the sensor element and feedback capacitor set a first load capacitance applied to the first input terminal of the operational amplifier; and
the voltage compensation circuit includes a plurality of balance capacitors that set a second load capacitance, which is applied to the second input terminal of the operational amplifier, to substantially the same value as the first load capacitance.

12. The capacitance detection circuit of claim 11, wherein the plurality of balance capacitors include:
a first balance capacitor having a first electrode, which is connected to the second input terminal of the operational amplifier, and a second electrode, which receives the first drive signal;
a second balance capacitor having a first electrode, which is connected to the first electrode of the first balance capacitor, and a second electrode, which receives the second drive signal;
a third balance capacitor having a first electrode, which is connected to the second input terminal of the operational amplifier, and a second electrode, which receives the reference voltage; and
a fourth balance capacitor having a first electrode, which is connected to the second input terminal of the operational amplifier, and a second electrode, which is connected to the second electrode of the third balance capacitor.

13. The capacitance detection circuit of claim 12, wherein:
a sum of the first variable capacitor and the second variable capacitor has a first capacitance, the parasitic capacitor has a second capacitance, and the feedback capacitor has a third capacitance; and
a sum of the first balance capacitor and the second balance capacitor is set to the first capacitance, the third balance capacitor is set to the second capacitance, and the fourth balance capacitor is set to the third capacitance.

14. The capacitance detection circuit of claim 12, wherein:
a first switch element connected in parallel to the feedback capacitor; and
a second switch element connected in parallel to the fourth balance capacitor and activated and deactivated simultaneously with the first switch element.

15. The capacitance detection circuit of claim 12, wherein the voltage divider is connected between the second electrode of the third balance capacitor and the second electrode of the fourth balance capacitor, for dividing the reference voltage by the predetermined ratio and applying the divided reference voltage to the second electrode of the third balance capacitor.

16. The capacitance detection circuit of claim 15, wherein:
a sum of the first variable capacitor and the second variable capacitor has a first capacitance, the parasitic capacitor has a second capacitance, and the feedback capacitor has a third capacitance; and
a sum of the first balance capacitor and the second balance capacitor is set to the first capacitance, the third balance capacitor is set to the second capacitance, and the fourth balance capacitor is set to the third capacitance.

17. The capacitance detection circuit of claim 16, wherein:
the voltage divider includes:
a first resistor circuit having a first resistance; and
a second resistor circuit having a second resistance;
the predetermined ratio is expressed by (second resistance/(first resistance+second resistance)); and
the first resistance and the second resistance are set to satisfy the following equation of:

second resistance/first resistance=(second capacitance/third capacitance)−1.

\* \* \* \* \*